(12) United States Patent
Zhou et al.

(10) Patent No.: US 9,349,670 B2
(45) Date of Patent: May 24, 2016

(54) SEMICONDUCTOR DIE ASSEMBLIES WITH HEAT SINK AND ASSOCIATED SYSTEMS AND METHODS

(71) Applicant: Micron Technology, Inc., Boise, ID (US)

(72) Inventors: Wei Zhou, Singapore (SG); Zhaohui Ma, Singapore (SG); Aibin Yu, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/451,192

(22) Filed: Aug. 4, 2014

(65) Prior Publication Data

US 2016/0035648 A1    Feb. 4, 2016

(51) Int. Cl.
| | |
|---|---|
| *H01L 23/02* | (2006.01) |
| *H01L 23/12* | (2006.01) |
| *H01L 23/373* | (2006.01) |
| *H01L 25/065* | (2006.01) |
| *H01L 23/367* | (2006.01) |
| *H01L 25/00* | (2006.01) |
| *H01L 21/48* | (2006.01) |

(52) U.S. Cl.
CPC ........ *H01L 23/3738* (2013.01); *H01L 21/4878* (2013.01); *H01L 23/367* (2013.01); *H01L 25/0657* (2013.01); *H01L 25/50* (2013.01)

(58) Field of Classification Search
CPC ............................ H01L 23/367; H01L 23/3672
USPC ............................ 257/686, 707, 713, E23.101
See application file for complete search history.

(56) References Cited

U.S. PATENT DOCUMENTS

| | | | | |
|---|---|---|---|---|
| 6,924,556 | B2 * | 8/2005 | Cha ..................... | B23K 1/0016 257/723 |
| 7,026,719 | B2 * | 4/2006 | Wang .................... | H01L 23/13 257/673 |
| 7,781,882 | B2 * | 8/2010 | Zhong ................... | H01L 23/128 257/707 |
| 2012/0171814 | A1 * | 7/2012 | Choi ..................... | H01L 21/561 438/107 |
| 2013/0026643 | A1 * | 1/2013 | England ............... | H01L 21/561 257/774 |
| 2014/0168902 | A1 * | 6/2014 | Park ..................... | H01L 23/367 361/719 |
| 2015/0155218 | A1 * | 6/2015 | Hung .................... | H01L 23/367 257/690 |

\* cited by examiner

*Primary Examiner* — Nitin Parekh
(74) *Attorney, Agent, or Firm* — Perkins Coie LLP

(57) ABSTRACT

Semiconductor die assemblies with heat sinks are disclosed herein. In one embodiment, a semiconductor die assembly includes a stack of semiconductor dies and a mold material surrounding at least a portion of the stack of semiconductor dies. A heat sink is disposed on the stack of semiconductor dies and adjacent the mold material. The heat sink includes an exposed surface and a plurality of heat transfer features along the exposed surface that are configured to increase an exposed surface area compared to a planar surface.

16 Claims, 12 Drawing Sheets

SEMICONDUCTOR DIE ASSEMBLIES WITH HEAT SINK AND ASSOCIATED SYSTEMS AND METHODS

TECHNICAL FIELD

The disclosed embodiments relate to semiconductor die assemblies and to managing heat within such assemblies. In particular, the present technology relates to stacked semiconductor die assemblies with heat sinks and associated systems and methods.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-substrate vias (TSVs).

In vertically stacked packages, the heat generated is difficult to dissipate, which increases the operating temperatures of the individual dies, the junctions therebetween, and the package as a whole. This can cause the stacked dies to reach temperatures above their maximum operating temperatures ($T_{max}$) in many types of devices.

DETAILED DESCRIPTION

Specific details of several embodiments of stacked semiconductor die assemblies having heat sinks and associated systems and methods are described below. The terms "semiconductor device" and "semiconductor die" generally refer to a solid-state device that includes semiconductor material, such as a logic device, memory device, or other semiconductor circuit, component, etc. Also, the terms "semiconductor device" and "semiconductor die" can refer to a finished device or to an assembly or other structure at various stages of processing before becoming a finished device. Depending upon the context in which it is used, the term "substrate" can refer to a wafer-level substrate or to a singulated, die-level substrate. A person skilled in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-5.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as being inverted.

Figure 1:
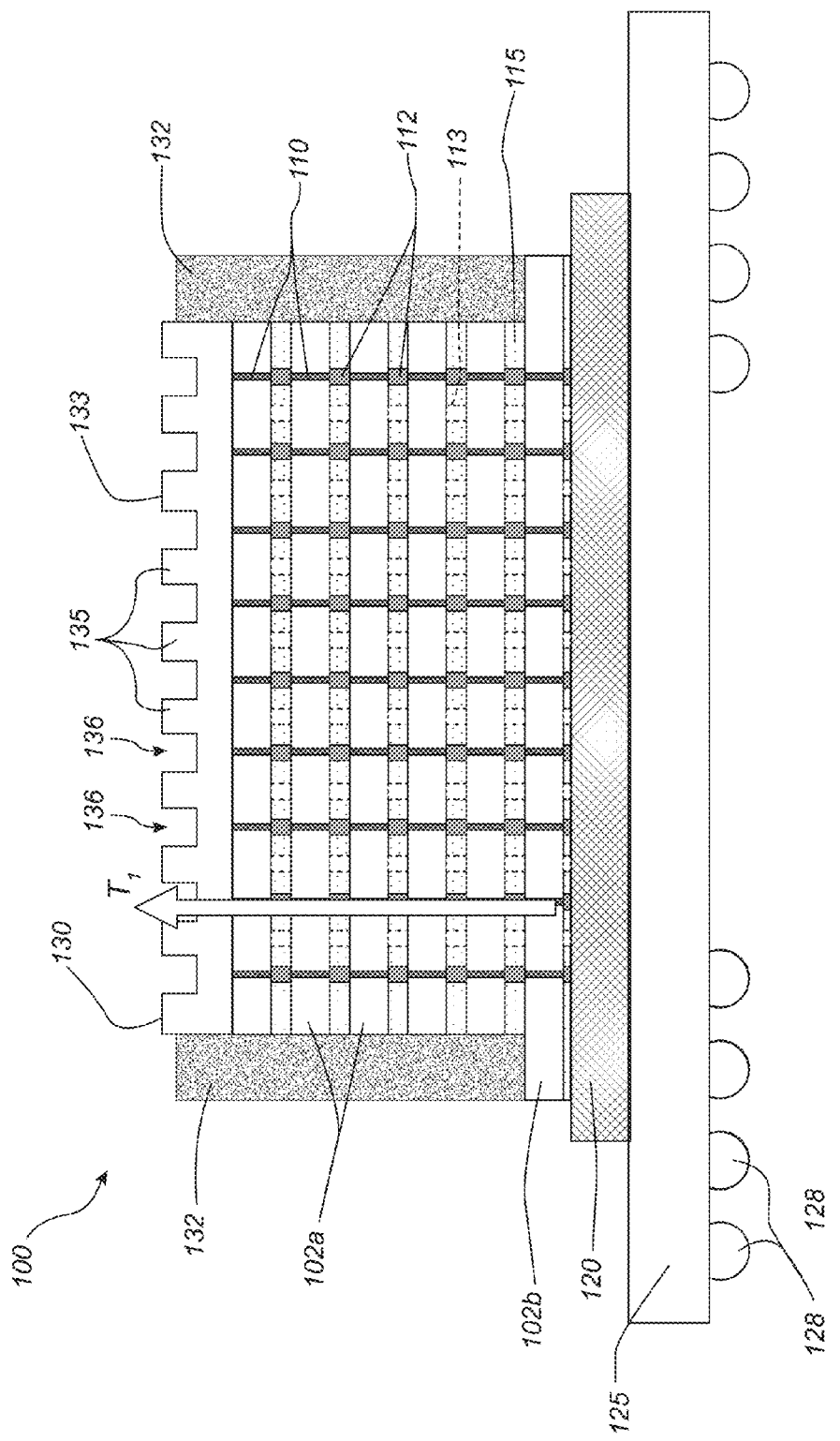
FIG. 1 is a cross-sectional view of a semiconductor die assembly configured in accordance with an embodiment of the present technology.

FIG. 1 is a cross-sectional view of a semiconductor die assembly 100 ("assembly 100") configured in accordance with an embodiment of the present technology. The assembly 100 includes a stack of first semiconductor dies 102a carried by a second semiconductor die 102b (collectively "semiconductor dies 102"). The second semiconductor die 102b, in turn, is carried by an interposer 120. The interposer 120 can include, for example, a semiconductor die, a dielectric spacer, and/or another suitable substrate having electrical connectors (not shown), such as vias, metal traces, etc.) connected between the interposer 120 and a package substrate 125. The package substrate 125 can include, for example, an interposer, a printed circuit board, another logic die, or another suitable substrate connected to electrical connectors 128 (e.g., solder balls) that electrically couple the assembly 100 to external circuitry (not shown). In some embodiments, the package substrate 125 and/or the interposer 120 can be configured differently. For example, in some embodiments the interposer 120 can be omitted and the second semiconductor die 102b can be directly connected to the package substrate 125.

The semiconductor dies 102 each include a plurality of vias 110 (e.g., TSVs) that have a thermally and/or electrically conductive material extending through the semiconductor dies 102. The vias 110 are aligned on one or both sides with corresponding electrically conductive elements 112 between the semiconductor dies 102. In addition to electrical communication, the electrically conductive elements 112 can function as thermally conductive elements, or thermal conduits, through which heat can be transferred away from the semiconductor dies 102 (as shown, e.g., by arrow $T_1$). In some embodiments, the assembly 100 can also include a plurality of thermally conductive elements 113 (shown in broken lines) positioned interstitially between the electrically conductive elements 112 in the space between adjacent semiconductor dies 102. The individual thermally conductive elements 113 can be at least generally similar in structure and composition as that of the electrically conductive elements 112 (e.g., copper pillars). However, the thermally conductive elements 113 are not electrically coupled to the semiconductor dies 102. Instead, the thermally conductive elements 113 can serve as additional thermal conduits through which thermal energy can be transferred away from the semiconductor dies 102 to transfer additional heat.

The semiconductor dies 102 can be at least partially encapsulated in a dielectric underfill material 115. The underfill material 115 can be deposited or otherwise formed around and/or between the semiconductor dies 102 to electrically isolate the electrically conductive elements 112 and/or enhance the mechanical connection between the semiconductor dies 102. In some embodiments, the underfill material 115 can be selected based on its thermal conductivity to enhance heat dissipation through the semiconductor dies 102.

The semiconductor dies 102 can each be formed from a semiconductor substrate, such as silicon, silicon-on-insulator, compound semiconductor (e.g., Gallium Nitride), or other suitable substrate materials. The semiconductor substrate can be cut or singulated into semiconductor dies having any of variety of integrate circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a hybrid memory cube (HMC) in which the first semiconductor dies 102a provide data storage (e.g., DRAM dies) and the second semiconductor die 102b provides memory control (e.g., DRAM control) within the HMC. In some embodiments, the assembly 100 can include other semiconductor dies in addition to and/or in lieu of one or more of the semiconductor dies 102. For example, such semiconductor dies can include integrated circuit components other than data storage and/or memory control components. Further, although the assembly 100 includes six dies stacked on the interposer 120, in other embodiments the assembly 100 can include fewer than six dies (e.g., two dies, three dies, four dies, or five dies) or more than six dies (e.g., eight dies, twelve dies, sixteen dies, thirty-two dies, etc.). For example, in one embodiment, the assembly 100 can include seven memory dies stacked on two logic dies.

As further shown in FIG. 1, the assembly 100 also includes a heat sink 130 and an encapsulant or mold material 132 (e.g., an epoxy mold compound) surrounding the first semiconductor dies 102a. The heat sink 130 is adjacent the mold material 132 and includes an exposed surface 133 and a plurality of heat transfer features 135 along the exposed surface 133. In one aspect of the illustrated embodiment of FIG. 1, the heat transfer features 135 define a plurality of recesses or grooves 136 in the heat sink 130 that form fins which increase the surface area of the exposed surface 133 compared to a planar surface. In another embodiment, the heat transfer features 135 can be projections, such as fins, that extend away from the semiconductor dies. One advantage of the additional surface area is that it permits a heat transfer medium, such as air, to have increased thermal contact with the heat sink 130. Another advantage of the larger surface area is that it increases the rate at which heat can be transferred or dissipated away from the semiconductor dies 102. A related advantage is that the improved heat dissipation can lower the operating temperatures of the individual semiconductor dies 102 such that they stay below their designated maximum temperatures ($T_{max}$). This, in turn, allows the semiconductor die assembly 100 to be more closely packed and smaller than a conventional die assembly.

The heat sink 130 can include crystalline, semi-crystalline, and/or ceramic substrate materials, such as silicon, polysilicon, aluminum oxide ($Al_2O_3$), sapphire, and/or other suitable semiconductor materials having high thermal conductivities. In one embodiment described in greater detail below, the heat sink 130 does not include IC devices nor other active components, such as memory and logic circuitry. As such, the heat sink 130 does not provide any intermediary signal processing (e.g., logic operations, switching, etc.). Instead, the heat sink 130 can be configured as a "blank die" or a "blank semiconductor substrate." In various embodiments, the heat sink 130 can be similar in shape and/or size as one or more of the semiconductor dies 102. For example, in the illustrated embodiment of FIG. 1, the heat sink 130 has the same footprint as the first semiconductor dies 102a, but has a smaller footprint than the second semiconductor die 102b. In another embodiment described in greater detail below, the heat sink 130 can have a larger footprint than all of the semiconductor dies in a semiconductor die assembly.

Figure 2A:
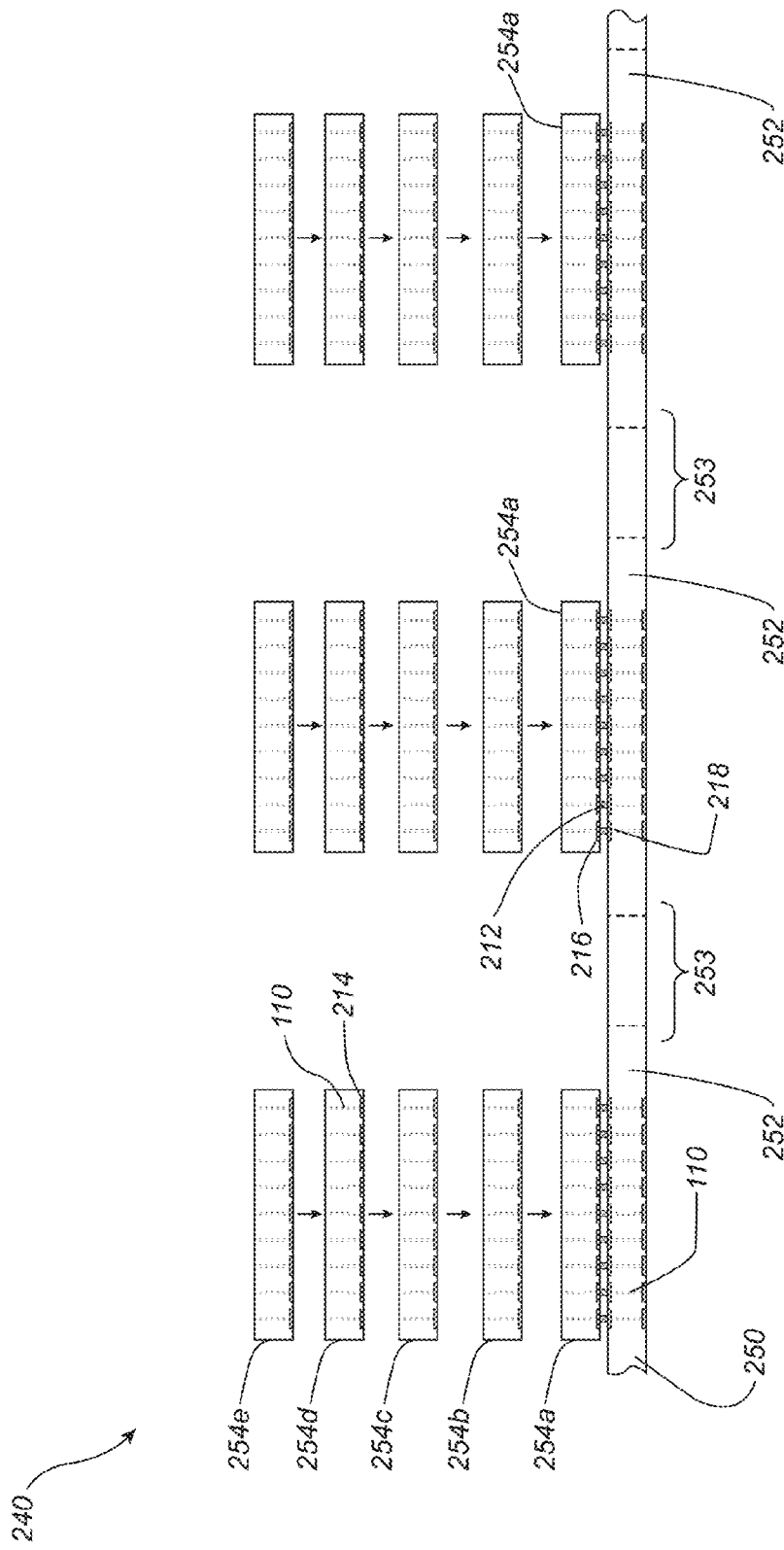
FIGS. 2A-2E are cross-sectional views illustrating a portion of a semiconductor device at various stages in a method for making semiconductor die assemblies in accordance with selected embodiments of the present technology.

FIGS. 2A-2E are cross-sectional views illustrating a portion of a semiconductor device 240 at various stages in a method for making semiconductor die assemblies in accordance with selected embodiments of the present technology. Referring first to FIG. 2A, the semiconductor device 240 includes a semiconductor substrate, or semiconductor wafer 250, containing a plurality of logic dies 252 separated from one another by dicing lanes 253. As shown, a plurality of memory dies 254 (identified individually as first through fifth memory dies 254a-e) is stacked upon each of the corresponding logic dies 252. The first memory dies 254a include a plurality of contact pads 216 coupled to corresponding contact pads 218 of the logic dies 252 by conductive elements 212. After attaching the first memory dies 254a, the second through fifth memory dies 202b-202e can be stacked in sequence upon corresponding first memory dies 254a. Contact pads 214 of the second through fifth memory dies 254b-254d can be connected to conductive elements as disposed between each of the memory dies 254 (shown as small connective bumps in FIG. 2B). In an alternate embodiment, the entire stack of memory dies 254 can be preassembled, and the entire stack of the memory dies 254 can be attached to the corresponding logic dies 252 at the same time.

Figure 2B:
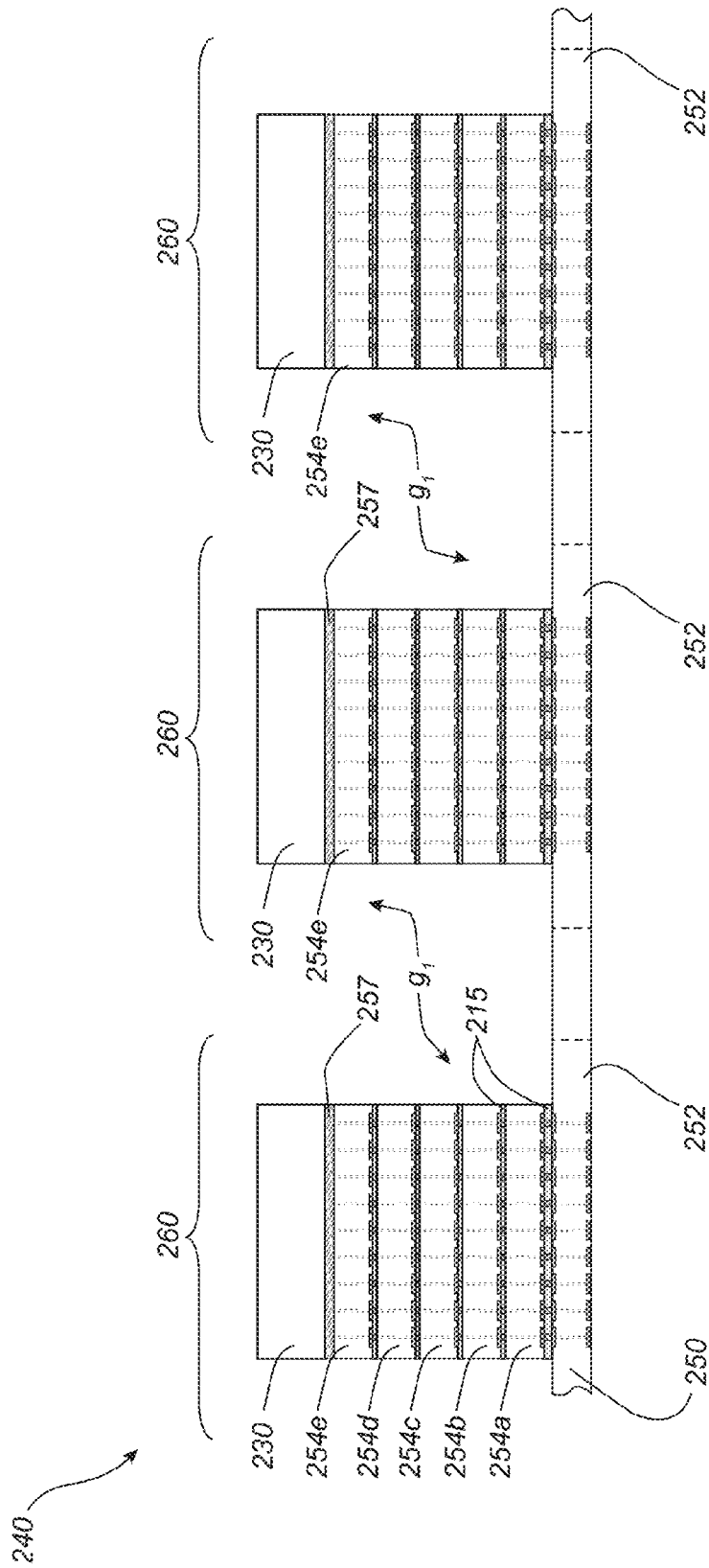

FIG. 2B shows the semiconductor device 240 after stacking semiconductor substrates, or semiconductor blanks 230 (e.g., blank silicon dies), on corresponding fifth memory dies 254e and flowing an underfill material 215 between each of the memory dies 254 and between the first memory dies 254a and the logic dies 252. As shown, the memory dies 254 and the semiconductor blanks 230 form individual die stacks 260 that are separated from one another by gaps $g_1$. In the illustrated embodiment of FIG. 2B, an interface material 257 is disposed between the semiconductor blanks 230 and the fifth memory dies 254e. In various embodiments, the interface material 257 can be made from what are known in the art as "thermal interface materials" ("TIMs"), designed to increase the thermal conductance at surface junctions (e.g., between a die surface and a heat spreader). TIMs can include silicone-based greases, gels, or adhesives that are doped with conductive materials (e.g., carbon nano-tubes, solder materials, diamond-like carbon (DLC), etc.), as well as phase-change materials.

Figure 2C:
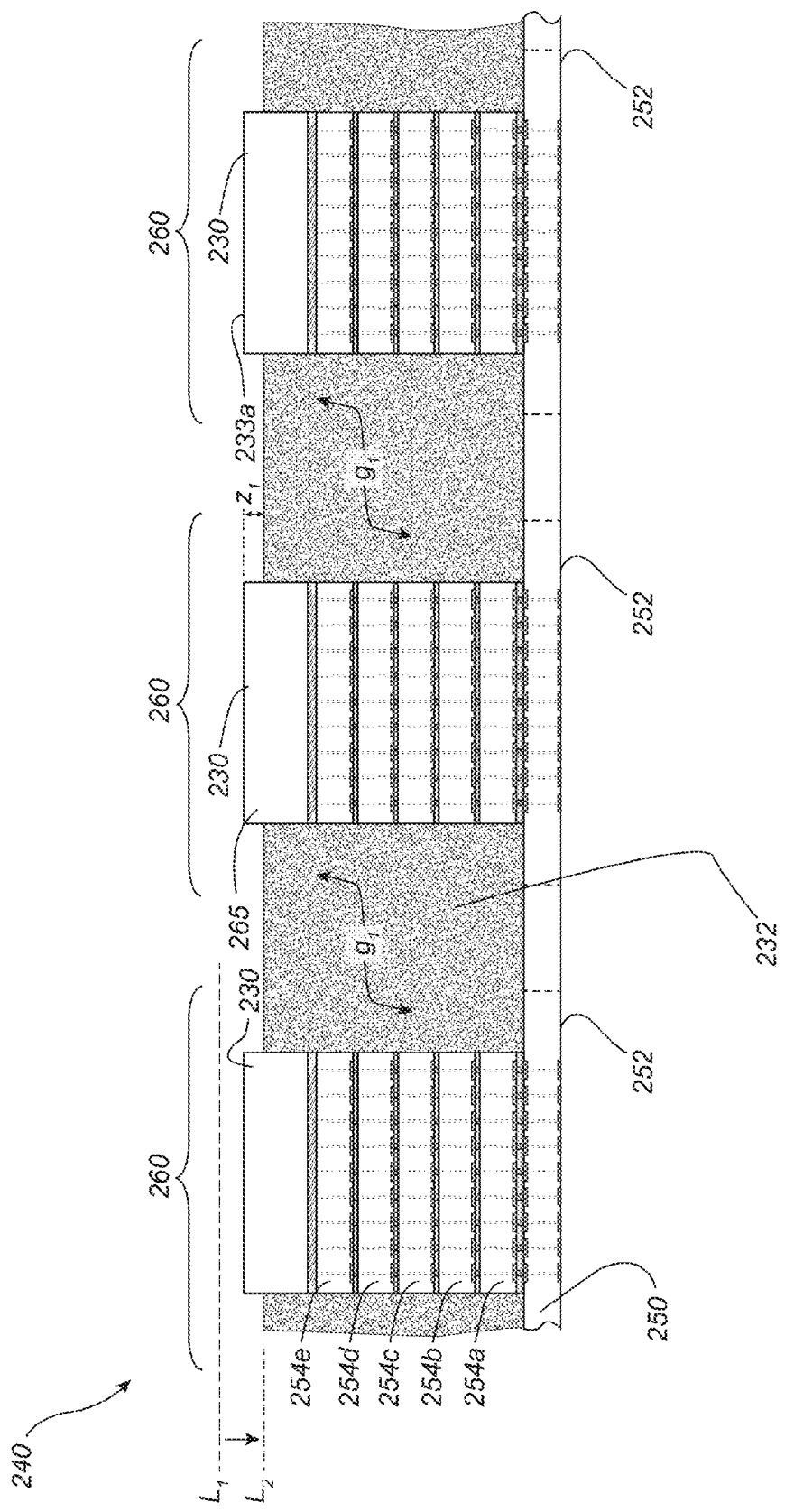

FIG. 2C shows the semiconductor device 240 after encapsulating the die stacks 260 with a mold material 232. The mold material 232 can be heated and compressed such that it liquefies and flows through the individual gaps $g_1$. After the mold material 232 fills the gaps $g_1$, it can be allowed to cool and harden. Once hardened, the mold material 232 can be thinned (e.g., via backgrinding) from a first thickness level $L_1$ to a second thickness level $L_2$ to expose a first surface 233a (e.g., a back-side surface) of each of the semiconductor blanks 230. In several embodiments, the mold material 232 can be thinned until a portion 265 of each of the semiconductor blanks 230 projects beyond the mold material 232 by a distance $z_1$, such as a distance of approximately 10 μm to approximately 100 μm.

Figure 2D:
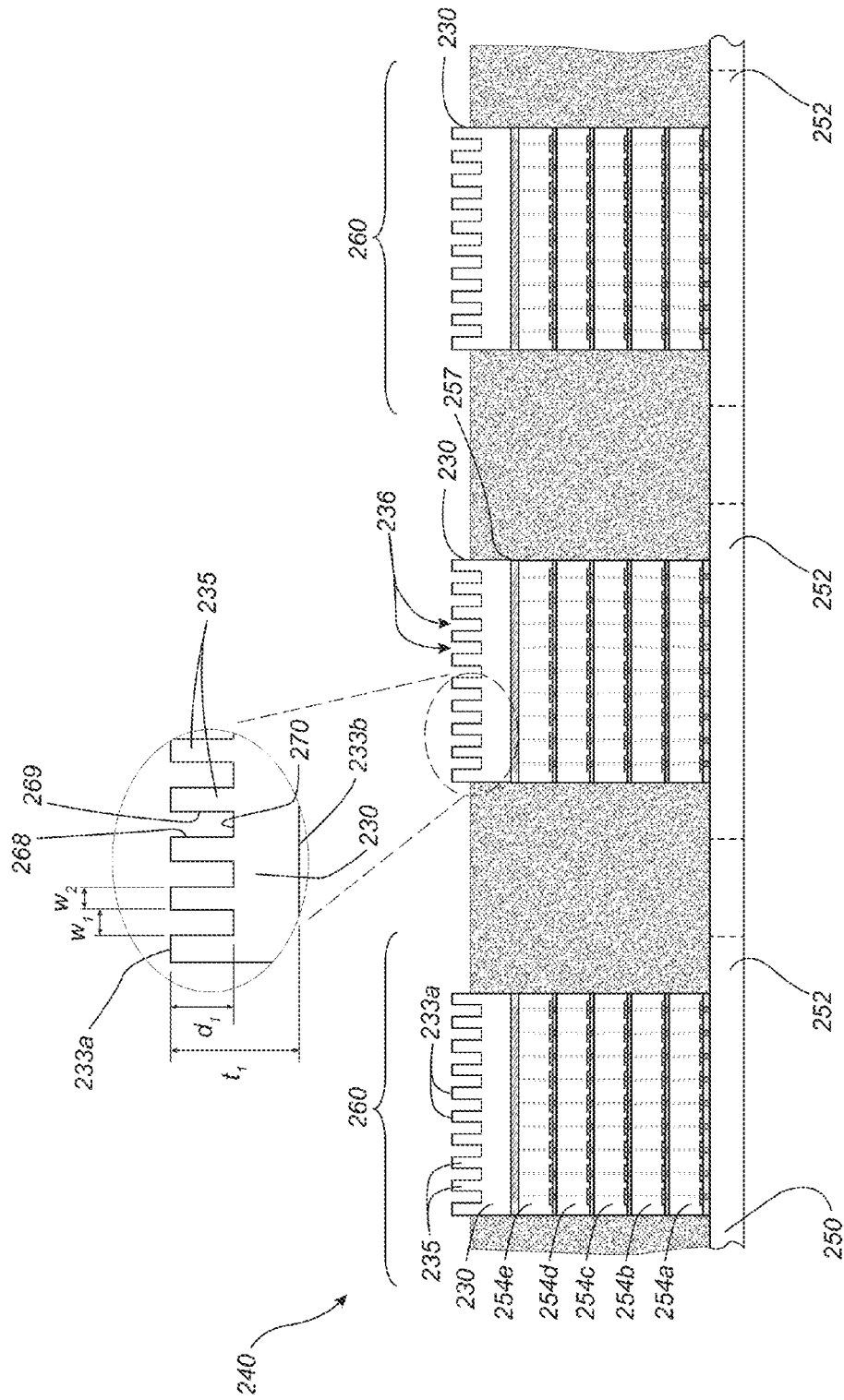

FIG. 2D shows the semiconductor device 240 after forming heat transfer features 235 in the first surface 233a of each of the semiconductor blanks 230. In one embodiment, the heat transfer features 265 can be formed by cutting recesses or grooves 236 (e.g., via a dicing blade) into the semiconductor blanks 230. For example, a dicing blade can cut grooves 260 through multiple semiconductor blanks in a semiconductor wafer before wafer dicing or simultaneously with wafer dicing. In some embodiments, other suitable processes, such as etching, can be used in addition to or in lieu of mechanically cutting grooves.

Referring to the inset view of FIG. 2D, each of the heat transfer features 235 includes a first heat transfer wall 268, a second heat transfer wall 269, and a portion of the first surface 233a. In a further aspect of this embodiment, the first and second heat transfer walls 268 and 269 can be generally parallel, and each wall can extend from the first surface 233a to a recessed surface 270. In other embodiments, however, the heat transfer walls 268 and 269 can be non-parallel and/or extent completely through the semiconductor blank 230 to expose portions of the interface material 257 aligned with the grooves 236.

In yet another aspect the illustrated embodiment of FIG. 2D, each heat transfer feature 235 has a generally similar shape and size. For example, the heat transfer feature 235 can be disposed in a portion of semiconductor substrate having a thickness $t_1$ defined by a distance between the first surface 233a and a second surface 233b (e.g., a front-side surface). Each heat transfer feature 235 can have a depth $d_1$ and a first width $w_1$, and can be spaced apart from adjacent heat transfer features 235 by a second distance $w_2$. In one embodiment, $d_1$ is approximately 150 μm, and $t_1$ is approximately 300 μm. In another embodiment, $d_1$ is from about one-fifth to about three-fourths the value of $t_1$. In still a further embodiment, $d_1$ is from about one-third to about one-half the value of $t_1$. In additional embodiments, $d_1$, $t_1$, $w_1$, and $w_2$ can have other values depending on the heat transfer requirements.

Figure 2E:
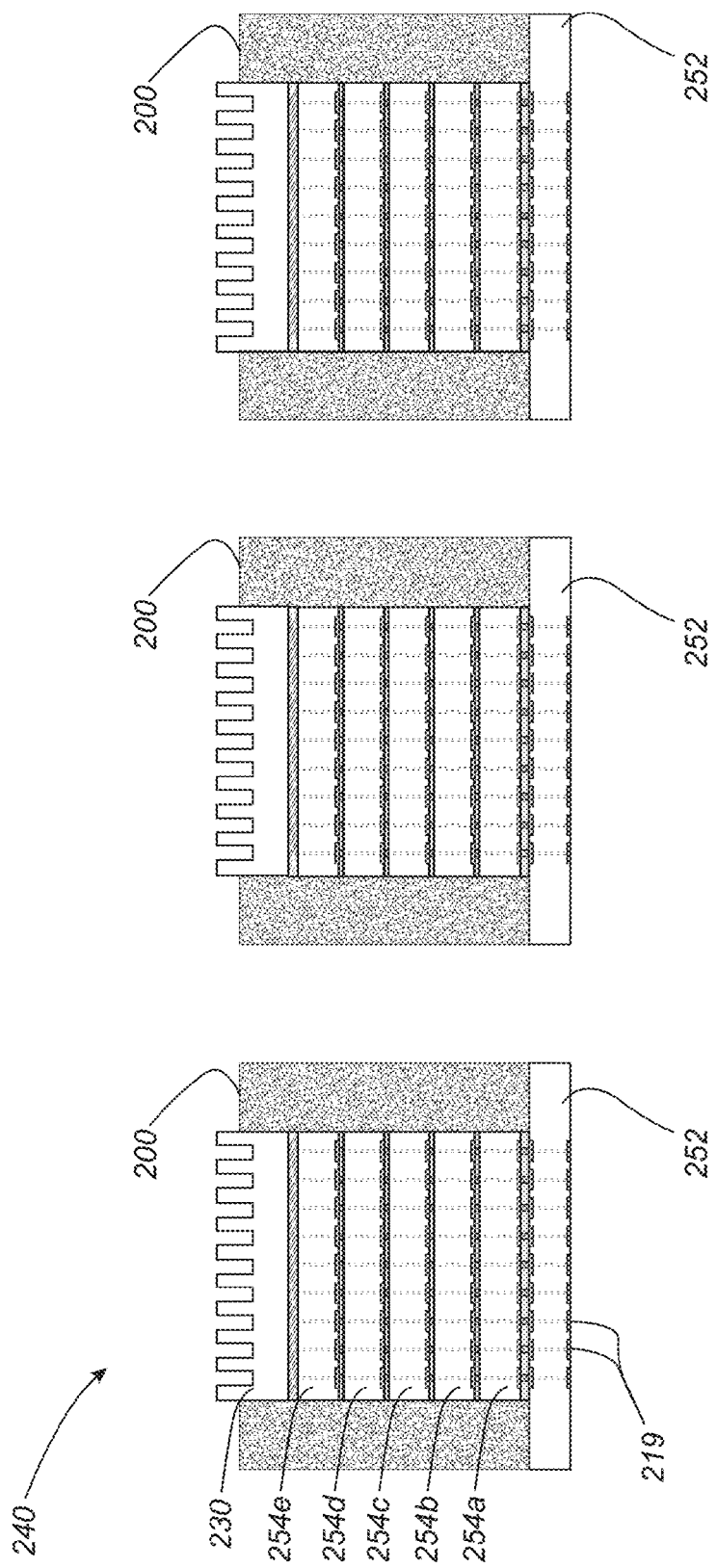

FIG. 2E shows the semiconductor device 240 after it has been singulated into separate semiconductor die assemblies 200. As shown, the semiconductor substrate 250 can be cut together with the mold material 232 at the dicing lanes 253 (FIG. 2A) to singulate the logic dies 252 and to separate the semiconductor die assemblies 200 from one another. Once singulated, the individual semiconductor die assemblies 200 can be attached to a substrate, such as a package or interposer substrate (not shown), at a subsequent processing stage. For example, in the illustrated embodiment the logic dies 252 include contact pads 219 that can be bonded to corresponding contact pads of the interposer 120 (FIG. 1).

Figure 3:
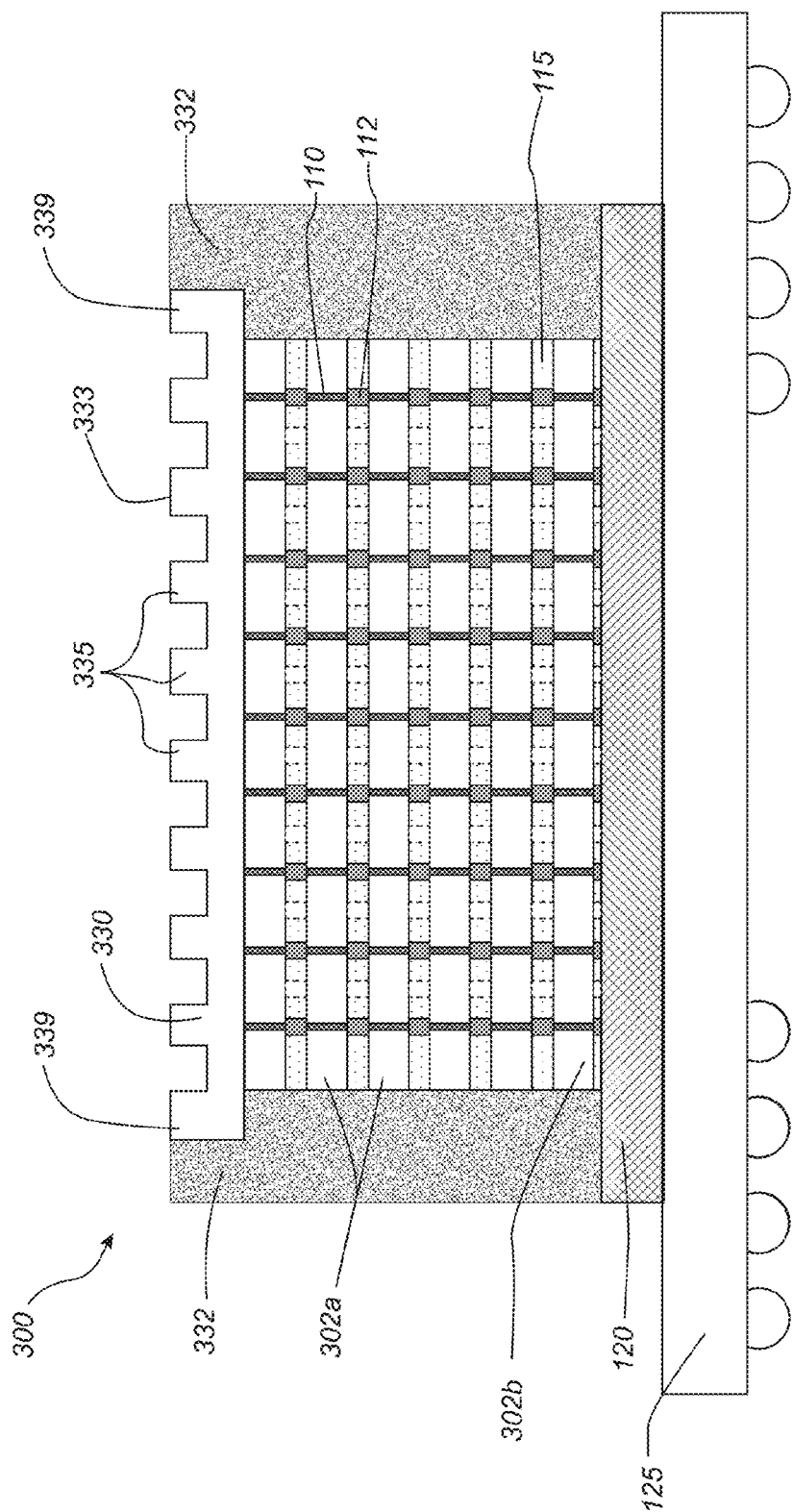
FIG. 3 is a cross-sectional view of a semiconductor die assembly configured in accordance with another embodiment of the present technology.

FIG. 3 is a cross-sectional view of a semiconductor die assembly 300 ("assembly 300") configured in accordance with another embodiment of the present technology. The assembly 300 can include features generally similar in structure and function to those of the semiconductor die assemblies described in detail above. For example, the assembly 300 can include a stack of first semiconductor dies 302a carried by a second semiconductor die 302b (collectively "semiconductor dies 302"). The assembly 300 also includes a mold material 332 and a heat sink 330 having a plurality of heat transfer features 335 integrally formed in an exposed surface 333. In the illustrated embodiment of FIG. 3, however, the mold material 332 surrounds the heat sink 330 and all of the semiconductor dies 302. Further, a peripheral portion 339 of the heat sink 330 extends beyond the footprint of the semiconductor dies 302. In one aspect of this embodiment, the peripheral portion 339 can facilitate additional heat transfer toward the periphery dies 302.

Figure 4A:
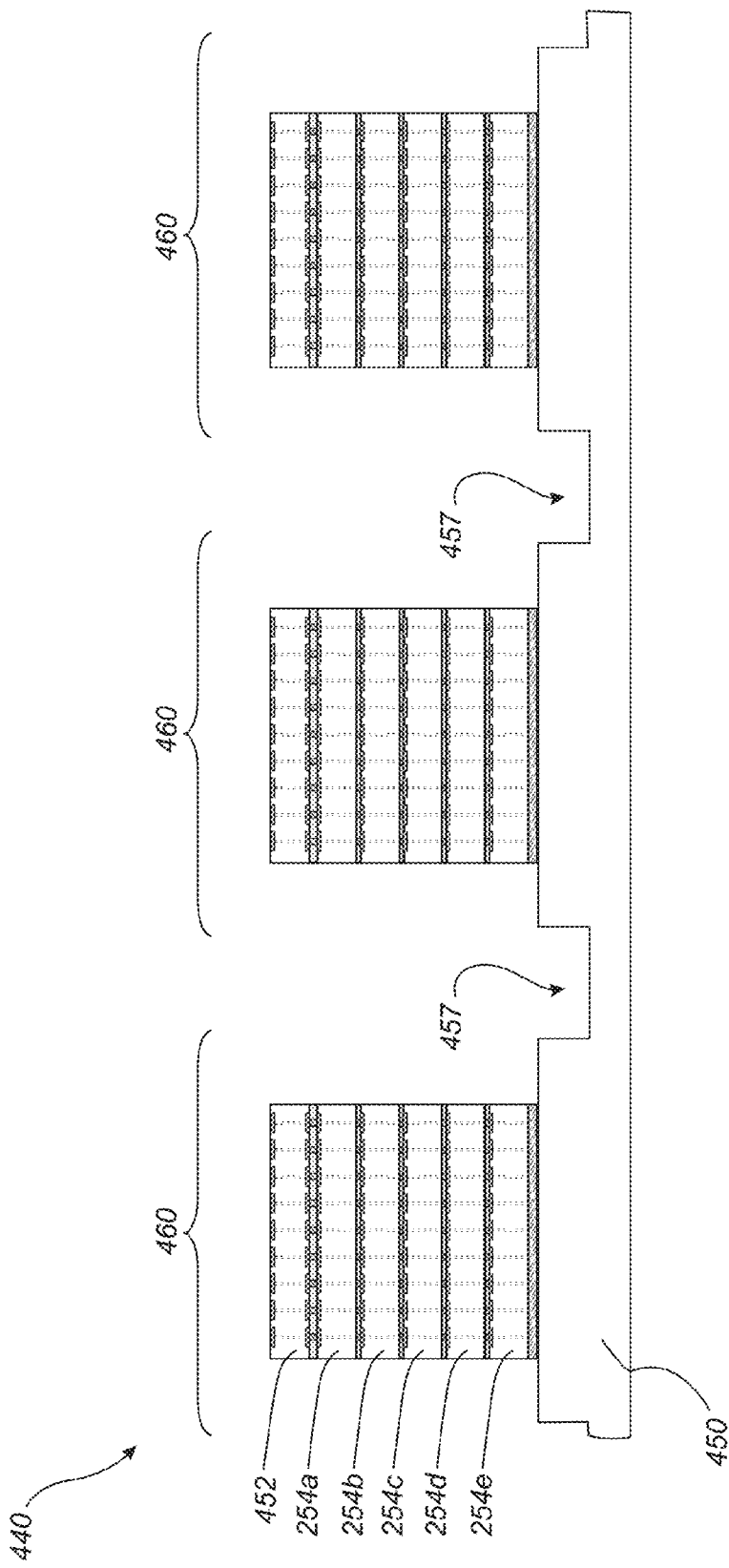
FIGS. 4A-4D are cross-sectional views illustrating a portion of a semiconductor device at various stages in a method for making semiconductor die assemblies in accordance with other selected embodiments of the present technology.

FIGS. 4A-4D are cross-sectional views illustrating a portion of a semiconductor device 440 at various stages in a method for making semiconductor die assemblies in accordance with other selected embodiments of the present technology. Referring first to FIG. 4A, the semiconductor device 440 includes a plurality of die stacks 460 formed on a semiconductor substrate, or semiconductor wafer 450 (e.g., a blank silicon substrate). The die stacks 460 include a logic die 452 stacked on a plurality of memory dies 454 (identified individually as first through fifth memory dies 454a-e). The memory dies 454, in turn, are stacked on the semiconductor wafer 450. In the illustrated embodiment of FIG. 4A, a plurality of recesses or first grooves 457 have been cut into the semiconductor wafer 450 (e.g., with a dicing blade) between the individual die stacks 460. As described in greater detail below, the first grooves 457 can be configured to facilitate the singulation of semiconductor dies from the semiconductor wafer 450. In other embodiments, however, the first grooves 457 can be omitted.

Figure 4B:
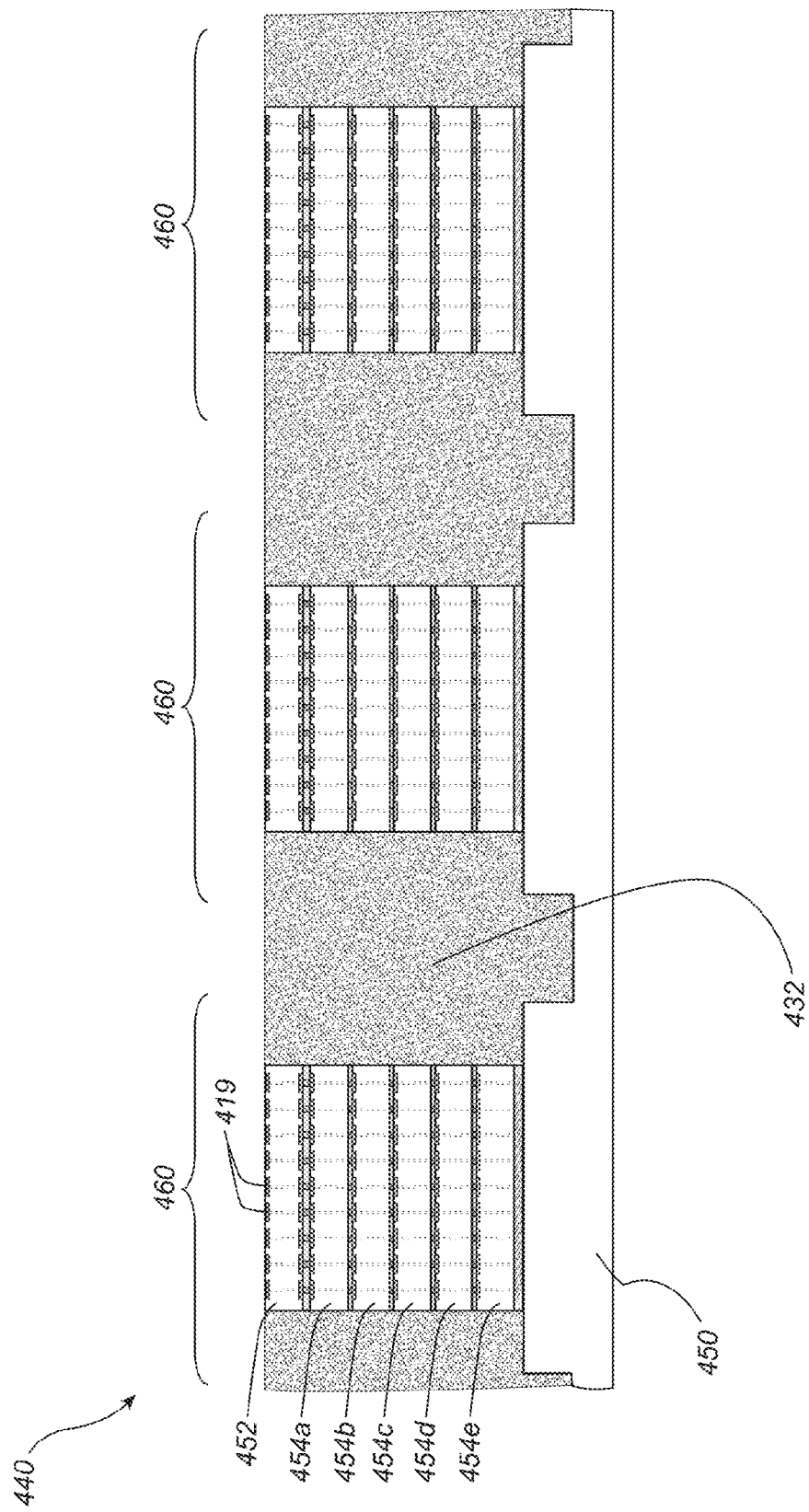

FIG. 4B shows the semiconductor device 440 after encapsulating the die stacks 460 with a mold material 432. Similar to the mold material 232 described above with reference to FIG. 2C, the mold material 432 can be disposed between the die stacks 460 and subsequently thinned. For example, the mold material 432 can be thinned to expose contact pads 419 of the logic die 452.

Figure 4C:
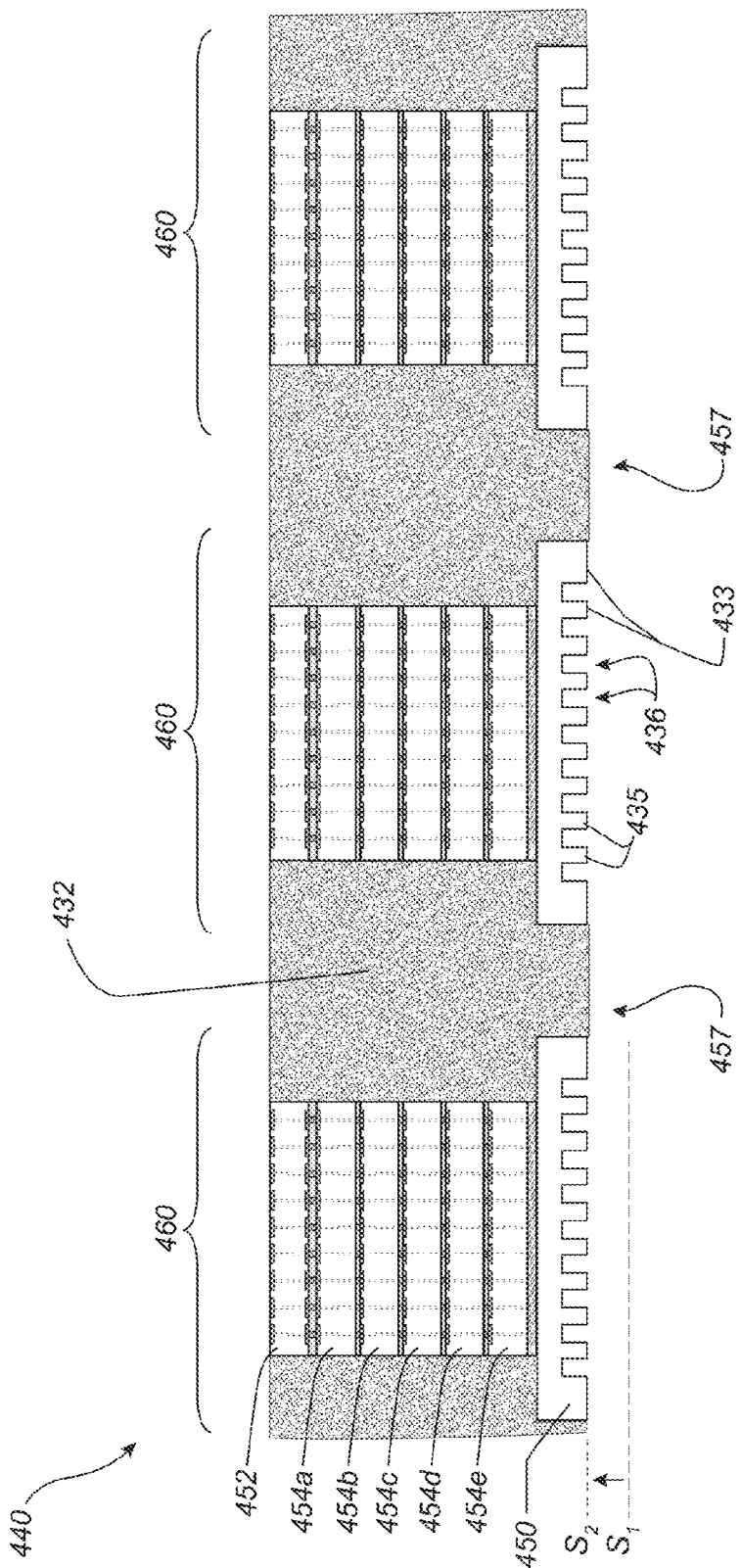

FIG. 4C shows the semiconductor device 440 after thinning the semiconductor wafer 450 to form individual heat sinks 430 under the die stacks 460 and forming heat transfer features 435 in the heat sinks 430. In the illustrated embodiment of FIG. 4C, the semiconductor wafer 450 has been thinned (e.g., via backgrinding) from a first first substrate level $S_1$ to second substrate level $S_2$ such that a portion of the mold material 432 within the first grooves 457 is exposed to thereby separate the portions of the semiconductor wafer 450 that define the heat sinks 430 from each other. Once the semiconductor wafer 450 has been thinned, the heat transfer features 435 can be formed by cutting recesses or second grooves 436 into the heat sinks 430.

Figure 4D:
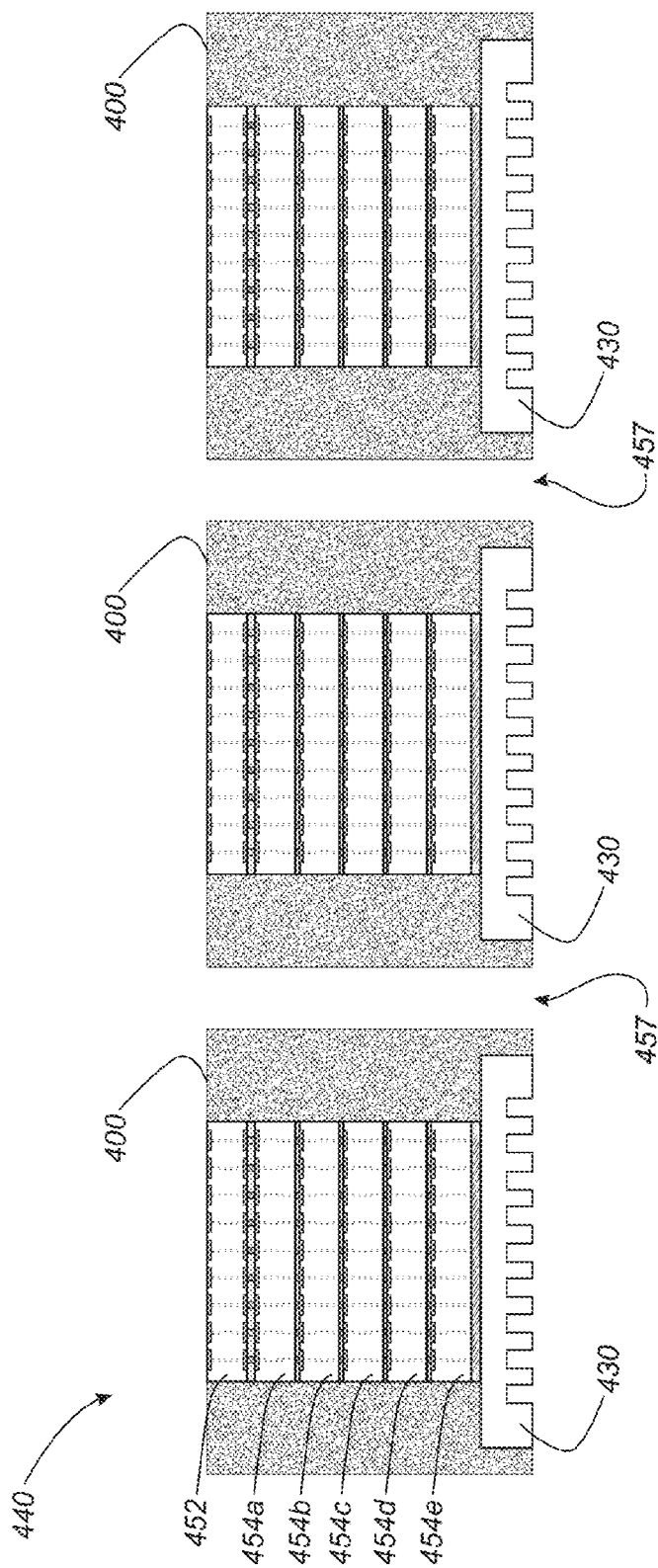

FIG. 4D shows the semiconductor device 440 after singulating the semiconductor wafer 450 (FIG. 4C) into separate individual die assemblies 400 from each other. As shown, the mold material 432 can be cut at the first grooves 457 to singulate the heat sinks 430 from the semiconductor wafer 450 and to separate the semiconductor die assemblies 400 from one another. Similar to the die assemblies 200 described above with reference to FIG. 2E, the individual die assemblies 400 can be attached to a substrate, such as a package or interposer substrate (not shown), at a subsequent processing stage.

Figure 5:
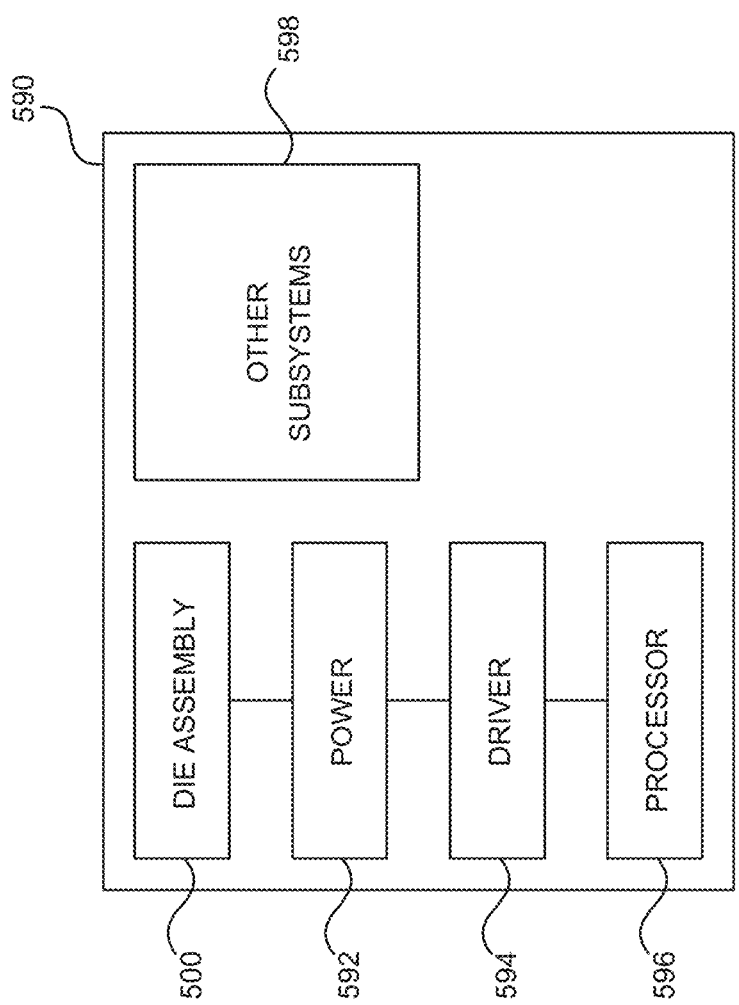
FIG. 5 is a schematic view of a system that includes a semiconductor die assembly configured in accordance with embodiments of the present technology.

Any one of the interconnect structures and/or semiconductor die assemblies described above with reference to FIGS. 1-4D can be incorporated into any of a myriad of larger and/or more complex systems, a representative example of which is system 590 shown schematically in FIG. 5. The system 590 can include a semiconductor die assembly 500, a power source 592, a driver 594, a processor 596, and/or other subsystems or components 598. The semiconductor die assembly 500 can include features generally similar to those of the stacked semiconductor die assemblies described above, and can therefore include various features that enhance heat dissipation. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the technology have been described herein for purposes of illustration, but that various modifications may be made without deviating from the disclosure. For example, while described as blank dies or wafers in the illustrated embodiments, the wafer 450 and the dies 130, 230, 330, and 450 can include memory and other functional features in other embodiments. In such embodiments, these wafers and dies may be non-TSV dies that are generally thicker to accommodate heat transfer features. Further, although several of the embodiments of the semiconductor dies assemblies are described with respect to HMCs, in other embodiments the semiconductor die assemblies can be configured as other memory devices or other types of stacked die assemblies. In addition, while in the illustrated embodiments certain features or components have been shown as having certain arrangements or configurations, other arrangements and configurations are possible. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor die assembly, comprising:
a stack of first semiconductor dies;
a mold material having a first portion surrounding at least a portion of the stack of first semiconductor dies, and a second portion extending beyond the stack of first semiconductor dies, wherein the second portion of the mold material defines an opening adjacent an outermost one of the first semiconductor dies; and
a heat sink including a second semiconductor die, wherein the second semiconductor die is positioned on the outermost one of the first semiconductor dies of the stack of first semiconductor dies and within the opening defined by the second portion of the mold material, and wherein the second semiconductor die has an exposed surface and a plurality of heat transfer features along the exposed surface that are configured to increase an exposed surface area compared to a planar surface.

2. The semiconductor die assembly of claim 1 wherein the second semiconductor die includes a silicon substrate.

3. The semiconductor die assembly of claim 1 wherein the heat transfer features are at least partially defined by a plurality of recesses in the second semiconductor die.

4. The semiconductor die assembly of claim 1 wherein the heat transfer features include fins.

5. The semiconductor die assembly of claim 4 wherein the fins are defined by a plurality of grooves in the second semiconductor die.

6. The semiconductor die assembly of claim 4 wherein the fins are defined by a plurality of projections.

7. The semiconductor die assembly of claim 1 wherein:
the second semiconductor die has a thickness $t_1$;
the heat transfer features extend a distance $d_1$ into the second semiconductor die; and
$d_1$ is approximately between about one-third and one-half of $t_1$.

8. The semiconductor die assembly of claim 1, further comprising a plurality of thermally conductive elements disposed between individual first semiconductor dies of the stack of first semiconductor dies.

9. The semiconductor die assembly of claim 1 wherein the stack of first semiconductor dies includes:
a logic die; and
a plurality of memory dies between the logic die and the heat sink.

10. The semiconductor die assembly of claim 9 wherein the heat sink does not contain logic circuitry nor memory circuitry.

11. The semiconductor die assembly of claim 1 wherein a portion of each of the heat transfer elements projects beyond the mold material.

12. The semiconductor die assembly of claim 1 wherein the heat transfer features include a plurality of fins defined by a plurality of grooves in the second semiconductor die, and wherein at least a portion of each of the grooves is recessed below the second portion of the mold material.

13. The semiconductor die assembly of claim 1 wherein a portion of the second semiconductor die extends beyond a footprint of the stack of first semiconductor dies.

14. A semiconductor die assembly, comprising:
a stack of first semiconductor dies having an outermost first die with an outer surface;
a mold material having a first portion adjacent the stack of first semiconductor dies and a second portion projecting from the first portion, wherein the first and second portions define a recess adjacent the outer surface of the outermost first die; and
a second semiconductor die on the outer surface of the outermost first die, wherein the second semiconductor die includes
an exposed surface,
a plurality of heat transfer features formed along the exposed surface, and
a peripheral portion that extends beyond a footprint of the outermost first die and into the recess of the mold material.

15. The semiconductor die assembly of claim 14 wherein:
the second portion of the mold material extends to a first height above the outermost first die;
the heat transfer features include a plurality of fins defined by a plurality of grooves in the second semiconductor die; and
the fins extend to a second height above the outermost first die that is equal to or greater than the first height.

16. The semiconductor die assembly of claim 14 wherein the second semiconductor die does not contain logic circuity nor memory circuity.

* * * * *